United States Patent
Mukai

(10) Patent No.: US 10,607,803 B2
(45) Date of Patent: Mar. 31, 2020

(54) ELECTRON MICROSCOPE AND METHOD OF CONTROLLING SAME

(71) Applicant: JEOL Ltd., Tokyo (JP)

(72) Inventor: Masaki Mukai, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/177,634

(22) Filed: Nov. 1, 2018

(65) Prior Publication Data

US 2019/0139734 A1 May 9, 2019

(30) Foreign Application Priority Data

Nov. 2, 2017 (JP) .................. 2017-212802

(51) Int. Cl.
| | |
|---|---|
| *H01J 37/05* | (2006.01) |
| *H01J 37/26* | (2006.01) |
| *H01J 37/12* | (2006.01) |
| *H01J 37/147* | (2006.01) |

(52) U.S. Cl.
CPC .............. *H01J 37/05* (2013.01); *H01J 37/12* (2013.01); *H01J 37/147* (2013.01); *H01J 37/261* (2013.01); *H01J 37/265* (2013.01); *H01J 2237/057* (2013.01); *H01J 2237/1501* (2013.01); *H01J 2237/24535* (2013.01); *H01J 2237/2802* (2013.01)

(58) Field of Classification Search
None
See application file for complete search history.

(56) References Cited

U.S. PATENT DOCUMENTS

| | | | | |
|---|---|---|---|---|
| 5,838,004 | A * | 11/1998 | Tiemeijer | H01J 37/05 250/305 |
| 2007/0138403 | A1* | 6/2007 | Cubric | H01J 37/05 250/396 ML |
| 2007/0181805 | A1* | 8/2007 | Mori | H01J 37/05 250/310 |
| 2009/0218508 | A1* | 9/2009 | Tamura | H01J 37/063 250/396 R |
| 2012/0080594 | A1* | 4/2012 | Schnell | H01J 37/21 250/306 |
| 2013/0248699 | A1* | 9/2013 | Mukai | H01J 37/023 250/252.1 |
| 2015/0371811 | A1* | 12/2015 | Ogawa | H01J 37/12 250/305 |
| 2016/0071683 | A1* | 3/2016 | Mukai | H01J 37/05 250/305 |

(Continued)

FOREIGN PATENT DOCUMENTS

JP 201639118 A 3/2016

*Primary Examiner* — Michael J Logie
(74) *Attorney, Agent, or Firm* — The Webb Law Firm

(57) ABSTRACT

An electron microscope includes an electron source, an extraction electrode that extracts an electron beam emitted from the electron source, a monochromator having an energy filter that disperses the electron beam emitted from the electron source based on an energy thereof and an energy selection slit that selects the energy of the electron beam, an incident-side electrode provided between the extraction electrode and the monochromator, and an incident-side electrode controller that controls the incident-side electrode based on a change in a voltage applied to the extraction electrode.

12 Claims, 9 Drawing Sheets

(56) References Cited

U.S. PATENT DOCUMENTS

| | | | |
|---|---|---|---|
| 2016/0079030 A1* | 3/2016 | Mukai | H01J 37/05 |
| | | | 250/305 |
| 2016/0104597 A1* | 4/2016 | Imai | H01J 27/26 |
| | | | 250/310 |
| 2017/0330723 A1* | 11/2017 | Mukai | H01J 37/3178 |
| 2019/0139734 A1* | 5/2019 | Mukai | H01J 37/147 |

* cited by examiner

ELECTRON MICROSCOPE AND METHOD OF CONTROLLING SAME

This application claims priority to Japanese Patent Application No. 2017-212802 filed Nov. 2, 2017, the disclosure of which is hereby incorporated in its entirety by reference.

BACKGROUND OF THE INVENTION

The present invention relates to an electron microscope and a method of controlling the same.

In general, a monochromator includes an energy filter serving as a spectroscopic part for an electron beam and an energy selection slit. The electron beam incident on the monochromator is split by the energy filter to form a spectrum corresponding to the energy distribution of the electron beam on the plane of the energy selection slit placed on an energy dispersion surface. In the energy selection slit, only an electron beam having a specified energy width corresponding to the slit width of the energy selection slit passes through the slit. This monochromatizes the electron beam (see, e.g., JP-A-2016-39118).

FIG. 6 is a diagram schematically illustrating an example of a configuration of a conventional monochromator 1100 with an internal electron gun. Note that, in FIG. 6, the illustration of an electron beam EB downstream of an energy selection slit 1104 is omitted.

The monochromator 1100 is embedded between an electron source 1002 and an acceleration tube (not shown) that accelerates the electron beam EB. On the incident side of the monochromator 1100, an incident-side electrode 1006 is provided. In addition, between the electron source 1002 and the incident-side electrode 1006, an extraction electrode 1004 is provided.

By applying a voltage to the extraction electrode 1004, an intense electric field is generated in the tip portion of the electron source 1002. Due to the electric field, the electron beam EB is emitted from the tip portion of the electron source 1002 (tunnel effect). The electron beam EB emitted from the electron source 1002 is caused by an electrostatic lens 1008 generated between the incident-side electrode 1006 and the monochromator 1100 to have parallel course and be incident on the monochromator 1100.

The monochromator 1100 has an energy filter 1102, an energy selection slit 1104, and a casing 1106 surrounding the energy filter 1102 and the energy selection slit 1104.

The energy filter 1102 generates a deflection field in the optical path of the electron beam EB. The energy filter 1102 splits the electron beam EB using the different pathways thereof resulting from the different speeds of electrons in the deflection field and projects, on the energy selection slit 1104, a spectrum corresponding to the energy distribution of the electron beam EB emitted from the electron source 1002. The resolution of the energy filter 1102 is about 10 μm/eV. As a result of passing through the slit of the energy selection slit 1104 having a width of several micrometers to submicrometers, the electron beam EB has an energy distribution corresponding to the width of the slit. As a result, the electron beam EB is monochromatized.

In an electron gun, by changing the voltage applied to the extraction electrode 1004, the electric field generated in the tip portion of the electron source 1002 is changed to allow a beam current (emission current) emitted from the electron source 1002 to be controlled.

The electric field generated in the tip portion of the electron source 1002 depends on the voltage applied to the extraction electrode 1004 and the radius of curvature of the tip portion of the electron source 1002. Accordingly, when the shape of the tip portion of the electron source 1002 has changed with time, the beam current emitted from the electron source 1002 is also changed.

To prevent this, in the electron gun, the voltage applied to the extraction electrode 1004 is controlled such that the beam current has a specific value. Specifically, the voltage applied to the extraction electrode 1004 is changed based on a change in the shape of the tip portion of the electron source 1002, i.e., based on a change in the beam current emitted from the electron source 1002.

When the monochromator 1100 is mounted in the electron gun, a change in the voltage applied to the extraction electrode 1004 affects the intensity of an electric field on the incident side of the monochromator 1100. In other words, the change in the voltage applied to the extraction electrode 1004 affects the electron optical system of the electron gun.

For example, when the voltage applied to the extraction electrode 1004 is changed to change the intensity of the electric field on the incident side of the monochromator 1100, the effect of an electrostatic lens formed between the extraction electrode 1004 and the incident-side electrode 1006 is changed. As a result, the convergence plane of the electron beam EB which should intrinsically coincide with the plane in which the energy selection slit 1104 is provided is displaced therefrom (see FIGS. 7 and 8). Consequently, the electron optical system of the monochromator 1100 falls out of optimal conditions (see FIG. 6) to degrade the performance of the monochromator 1100.

For example, as a result of a change in the voltage applied to the extraction electrode 1004 and a consequent change in the intensity of the electric field on the incident side of the monochromator 1100, the electron beam EB may be affected by axial misalignment resulting from an error in mechanically assembling the electron source 1002, the extraction electrode 1004, and the incident-side electrode 1006. As a result of the change in the voltage applied to the extraction electrode 1004, the electron beam EB is deflected under the influence of axial misalignment between the electron source 1002 and the extraction electrode 1004 and axial misalignment between the extraction electrode 1004 and the incident-side electrode 1006. Consequently, the deflected electron beam EB is incident directly on the energy filter 1102 (see FIG. 9).

As a result of a change in the voltage applied to the extraction electrode 1004 and a consequent change in the intensity of the electric field on the incident side of the monochromator 1100, an amount of deflection of the electron beam EB due to the axial misalignments described above is also changed to also change the angle of incidence of the electron beam EB with respect to the energy filter 1102. As a result, the electron optical system of the monochromator 1100 falls out of the optimal conditions (see FIG. 6) to degrade the performance of the monochromator 1100.

SUMMARY OF THE INVENTION

The invention can provide an electron microscope which can reduce the influence of a change in the voltage applied to an extraction electrode and a method of controlling the same.

According to a first aspect of the invention, there is provided an electron microscope including:
an electron source;
an extraction electrode that extracts an electron beam from the electron source;

a monochromator having an energy filter that disperses the electron beam emitted from the electron source based on an energy of the electron beam, and an energy selection slit that selects the energy of the electron beam;

an incident-side electrode provided between the extraction electrode and the monochromator; and a controller that controls the incident-side electrode based on a change in a voltage applied to the extraction electrode.

According to a second aspect of the invention, there is provided an electron microscope including:

an electron source;

an extraction electrode that extracts an electron beam from the electron source;

a monochromator having an energy filter that disperses the electron beam emitted from the electron source based on an energy of the electron beam, and an energy selection slit that selects the energy of the electron beam;

a deflector that is provided between the extraction electrode and the energy filter and deflects the electron beam; and a controller that controls the deflector based on a change in the voltage applied to the extraction electrode.

According to a third aspect of the invention, there is provided a method of controlling an electron microscope including: an electron source; an extraction electrode that extracts an electron beam from the electron source; a monochromator having an energy filter that disperses the electron beam emitted from the electron source based on an energy of the electron beam, and an energy selection slit that selects the energy of the electron beam; and an incident-side electrode provided between the extraction electrode and the monochromator, the method including:

controlling the incident-side electrode based on a change in a voltage applied to the extraction electrode.

According to a fourth aspect of the invention, there is provided a method of controlling an electron microscope including: an electron source; an extraction electrode that extracts an electron beam from the electron source; a monochromator having an energy filter that disperses the electron beam emitted from the electron source based on an energy of the electron beam, and an energy selection slit that selects the energy of the electron beam; and a deflector that is provided between the extraction electrode and the energy filter and deflects the electron beam, the method including:

controlling the deflector based on a change in a voltage applied to the extraction electrode.

DESCRIPTION OF THE INVENTION

Figure 1:
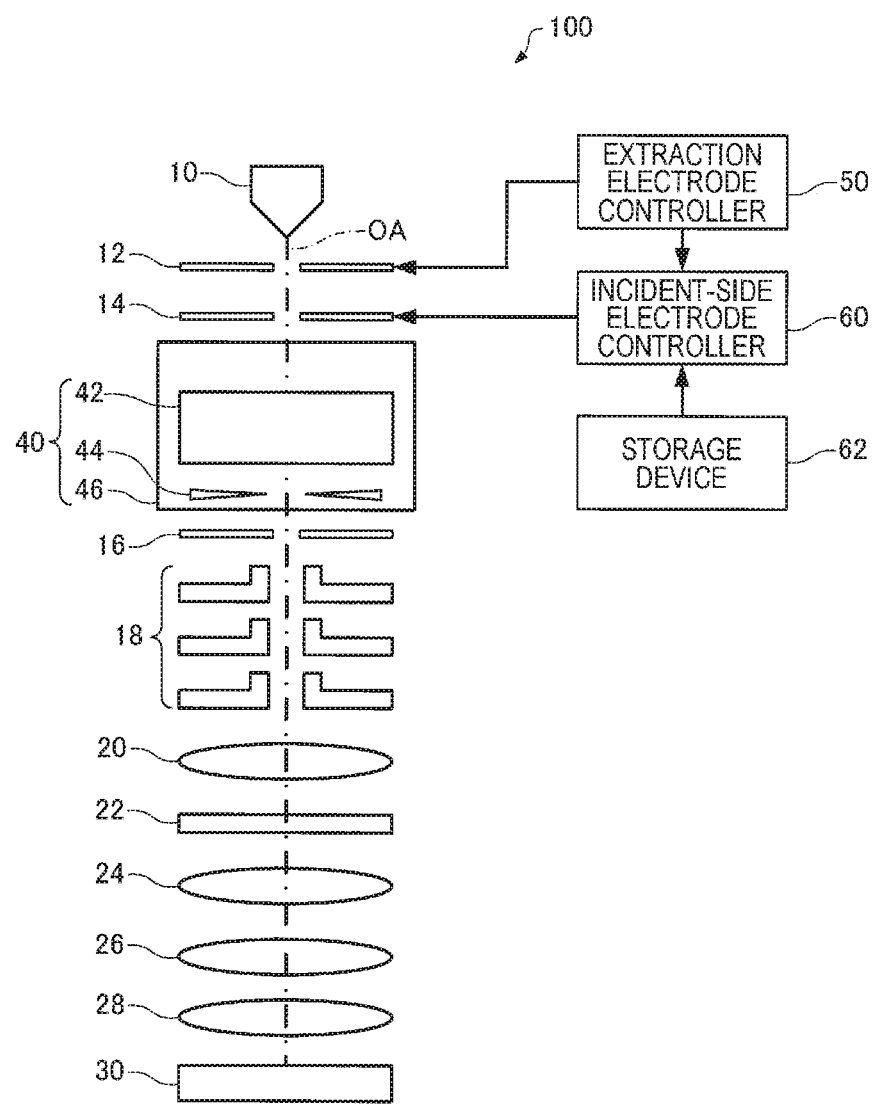
FIG. 1 is a diagram illustrating a configuration of an electron microscope according to a first embodiment.

According to one embodiment of the invention, there is provided an electron microscope including:

an electron source;

an extraction electrode that extracts an electron beam from the electron source;

a monochromator having an energy filter that disperses the electron beam emitted from the electron source based on an energy of the electron beam, and an energy selection slit that selects the energy of the electron beam;

an incident-side electrode provided between the extraction electrode and the monochromator; and a controller that controls the incident-side electrode based on a change in a voltage applied to the extraction electrode.

In the electron microscope shown above, the incident-side electrode is controlled based on the change in the voltage applied to the extraction electrode. As a result, even when the voltage applied to the extraction electrode is changed, it is possible to prevent the position of the convergence plane of the electron beam from being changed. Therefore, in the electron microscope shown above, the influence of the change in the voltage applied to the extraction electrode which is exerted on the monochromator can be reduced to allow the monochromator to have intended performance.

According to one embodiment of the invention, there is provided an electron microscope including:

an electron source;

an extraction electrode that extracts an electron beam from the electron source;

a monochromator having an energy filter that disperses the electron beam emitted from the electron source based on an energy of the electron beam, and an energy selection slit that selects the energy of the electron beam;

a deflector that is provided between the extraction electrode and the energy filter and deflects the electron beam; and a controller that controls the deflector based on a change in the voltage applied to the extraction electrode.

In the electron microscope shown above, the deflector is controlled based on the change in the voltage applied to the extraction electrode. As a result, even when the voltage applied to the extraction electrode is changed, it is possible to prevent the angle of incidence of the electron beam with respect to the energy filter from being changed. Therefore, in the electron microscope shown above, the influence of the change in the voltage applied to the extraction electrode which is exerted on the monochromator can be reduced to allow the monochromator to have intended performance.

According to one embodiment of the invention, there is provided a method of controlling an electron microscope including: an electron source; an extraction electrode that extracts an electron beam from the electron source; a monochromator having an energy filter that disperses the electron beam emitted from the electron source based on an energy of the electron beam, and an energy selection slit that selects the energy of the electron beam; and an incident-side electrode provided between the extraction electrode and the monochromator, and the method including:

controlling the incident-side electrode based on a change in a voltage applied to the extraction electrode.

In the method of controlling the electron microscope shown above, the incident-side electrode is controlled based on the change in the voltage applied to the extraction electrode. As a result, even when the voltage applied to the extraction electrode is changed, it is possible to prevent the position of the convergence plane of the electron beam from being changed. Therefore, in the method of controlling the electron microscope shown above, the influence of the change in the voltage applied to the extraction electrode which is exerted on the monochromator can be reduced to allow the monochromator to have intended performance.

According to one embodiment of the invention, there is provided a method of controlling an electron microscope including: an electron source; an extraction electrode that extracts an electron beam from the electron source; a monochromator having an energy filter that disperses the electron beam emitted from the electron source based on an energy of the electron beam, and an energy selection slit that selects the energy of the electron beam; and a deflector that is provided between the extraction electrode and the energy filter and deflects the electron beam, the method including:

controlling the deflector based on a change in a voltage applied to the extraction electrode.

In the method of controlling the electron microscope shown above, the deflector is controlled based on the change in the voltage applied to the extraction electrode. As a result, even when the voltage applied to the extraction electrode is changed, it is possible to prevent the angle of incidence of the electron beam with respect to the energy filter from being changed. Therefore, in the electron microscope shown above, the influence of the change in the voltage applied to the extraction electrode which is exerted on the monochromator can be reduced to allow the monochromator to have intended performance.

Preferred embodiments of the invention are described in detail below with reference to the drawings. Note that the following embodiments do not unduly limit the scope of the invention as stated in the claims. In addition, all of the elements described in connection with the following embodiments should not necessarily be taken as essential requirements of the invention.

1. First Embodiment 1.1. Electron Microscope

First, a description will be given of an electron microscope according to a first embodiment with reference to the drawings. FIG. 1 is a diagram illustrating a configuration of an electron microscope 100 according to the first embodiment. A description is given herein of the case where the electron microscope 100 has a configuration of a transmission electron microscope (TEM), but the electron microscope may also have a configuration of a scanning transmission electron microscope (STEM). Note that the electron microscope according to the first embodiment may also have a configuration obtained by omitting any of the components (individual portions) in FIG. 1.

As illustrated in FIG. 1, the electron microscope 100 includes an electron source 10, an extraction electrode 12, an incident-side electrode 14, an emission-side electrode 16, an acceleration tube 18, an illumination-system lens 20, a sample stage 22, an objective lens 24, an intermediate lens 26, a projection lens 28, a detector 30, a monochromator 40, an extraction electrode controller 50, an incident-side electrode controller 60, and a storage device 62.

The electron source 10 is an emission source of an electron beam, i.e., a negative electrode. The electron source 10 is formed of, e.g., a tungsten chip.

The extraction electrode 12 is an electrode for extracting an electron beam from the electron source 10. As a result of the application of a voltage to the extraction electrode 12, an intense electric field is generated in the tip portion of the electron source 10. Due to the intense electric field, electrons are extracted from the electron source 10 so that the electric beam is emitted.

The incident-side electrode 14 is provided in a stage previous to that of the monochromator 40. The incident-side electrode 14 is provided between the extraction electrode 12 and the monochromator 40. By applying a voltage to the incident-side electrode 14, between the incident-side electrode 14 and the monochromator 40 (casing 46), an electrostatic lens (electrostatic lens 15 in FIG. 2) is formed. The electrostatic lens adjusts the pathway of the electron beam emitted from the electron source 10.

The monochromator 40 is incorporated in the illumination system of the electron microscope 100. More specifically, the monochromator 40 is incorporated in an electron gun. The monochromator 40 is provided between the electron source 10 and the acceleration tube 18. The details of the monochromator 40 will be described later.

The emission-side electrode 16 is provided in a stage subsequent to that of the monochromator 40. Specifically, the emission-side electrode 16 is provided between the monochromator 40 and the acceleration tube 18. By applying a voltage to the emission-side electrode 16, an electrostatic lens is formed between the emission-side electrode 16 and the monochromator 40 (casing 46). Using the electrostatic lens, the pathway of the electron beam emitted from the monochromator 40 is adjusted.

The acceleration tube 18 accelerates the electron beam monochromatized by the monochromator 40. The electron beam monochromatized by the monochromator 40 is accelerated by the acceleration tube 18 and caused by the illumination-system lens 20 to illuminate a sample on the sample stage 22.

The illumination-system lens 20 is a lens for illuminating a sample with an electron beam. The illumination-system lens 20 may also include a plurality of convergence lenses.

The sample stage 22 holds the sample. The sample stage 22 includes a movement mechanism for moving the sample and an inclination mechanism for inclining the sample.

The objective lens 24 forms an image of the electron beam transmitted by the sample. The intermediate lens 26 and the projection lens 28 enlarge the image formed by the objective lens 24 to form the image on the detector 30.

The detector 30 detects a transmission electron microscope image (TEM image) formed by an image formation system including the objective lens 24, the intermediate lens 26, and the projection lens 28. The detector 30 is, e.g., a digital camera such as, e.g., a charge coupled device (CCD) camera.

The extraction electrode controller 50 controls the extraction electrode 12. The incident-side-electrode controller 60 controls the incident-side electrode 14. The function of the extraction electrode controller 50 and the function of the incident-side electrode controller 60 can be implemented using, e.g., dedicated circuits. The operations of the extraction electrode controller 50 and the incident-side electrode controller 60 will be described later.

Figure 2:
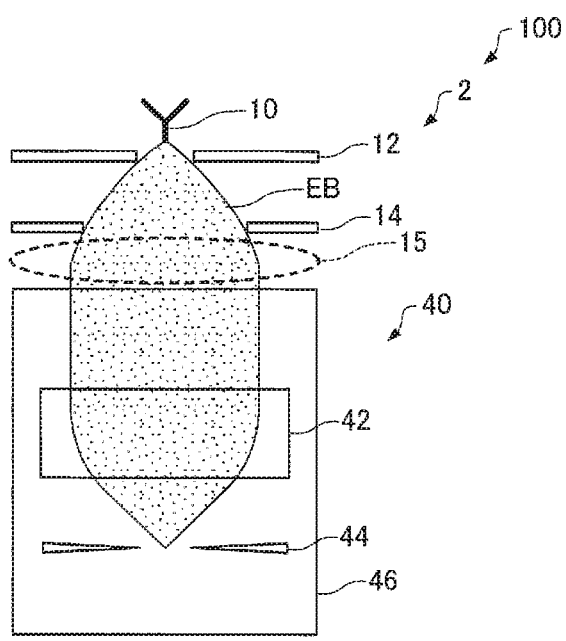
FIG. 2 is a diagram illustrating a configuration of an electron gun in the electron microscope according to the first embodiment.

FIG. 2 is a diagram illustrating a configuration of an electron gun 2 in the electron microscope 100. Note that, in FIG. 2, for the sake of convenience, a portion from the electron source 10 to the monochromator 40 is illustrated. Also, in FIG. 2, the illustration of the electron beam EB downstream of an energy selection slit 44 is omitted.

In the electron microscope 100, the monochromator 40 is incorporated in the electron gun 2. The electron gun 2 includes the electron source 10, the extraction electrode 12, the incident-side electrode 14, the monochromator 40, and the emission-side electrode 16 (see FIG. 1).

The monochromator 40 includes an energy filter 42 that disperses the electron beam EB emitted from the electron source 10 based on an energy thereof, the energy selection slit 44 that selects the energy of the electron beam EB, and the casing 46 that surrounds the energy filter 42 and the energy selection slit 44.

The energy filter 42 generates a deflection field in the optical path of the electron beam EB. The energy filter 42 splits the electron beam EB using the different pathways thereof resulting from the different speeds of electrons in the deflection field and projects, on the energy selection slit 44, a spectrum corresponding to the energy distribution of the electron beam EB emitted from the electron source 10. The resolution of the energy filter 42 is about 10 μm/eV. As a result of passing through the slit of the energy selection slit 44 having a width of several micrometers to submicrometers, the electron beam EB has an energy distribution corresponding to the width of the slit. As a result, the electron beam EB is monochromatized.

The casing 46 is formed of a conductive member and maintained at a predetermined potential by a monochromator power supply (not shown). The casing 46 stabilizes the potential of the electron beam EB which passes therethrough to stabilize the operation of the monochromator 40.

1.2. Operation of Electron Microscope

Next, a description will be given of the operation of the electron microscope 100. The description is given herein of the operations of the extraction electrode controller 50 and the incident-side electrode controller 60.

The extraction electrode controller 50 controls the voltage applied to the extraction electrode 12 such that a beam current emitted from the electron source 10 is maintained at an intended current value. When the shape of the tip portion of the electron source 10 is changed, the beam current emitted from the electron beam EB is also changed. Accordingly, the extraction electrode controller 50 controls the voltage applied to the extraction electrode 12 such that, even when the shape of the tip portion of the electron source 10 is changed, the beam current emitted from the electron source 10 is maintained at the intended current value.

When the voltage applied to the extraction electrode 12 is changed, the position of the convergence plane of the electron beam EB is also changed. To prevent this, in the electron microscope 100, the incident-side electrode controller 60 controls the incident-side electrode 14 based on a change in the voltage applied to the extraction electrode 12.

Specifically, the incident-side electrode controller 60 controls the voltage applied to the incident-side electrode 14 to prevent the position of the convergence plane of the electron beam EB from being changed by a change in the voltage applied to the extraction electrode 12, i.e., prevent the position where the electron beam EB is converged in a direction along an optical axis OA of the illumination system from being changed. In other words, the incident-side electrode controller 60 controls the voltage applied to the incident-side electrode 14 such that, even when the voltage applied to the extraction electrode 12 is changed, the electron beam EB is converged on the energy selection slit 44.

By changing the voltage applied to the incident-side electrode 14, it is possible to change an effect of the electrostatic lens 15 formed between the incident-side electrode 14 and the monochromator 40 (casing 46) with respect to the electron beam EB. By changing the voltage applied to the incident-side electrode 14, it is possible to change the effect of the electrostatic lens 15 and control the position of the convergence plane of the electron beam EB.

Due to the control of the incident-side electrode 14 by the incident-side electrode controller 60 described above, even when the voltage applied to the extraction electrode 12 is changed, the electron beam EB is allowed to be converged on the energy selection slit 44.

The incident-side electrode controller 60 determines the voltage to be applied to the incident-side electrode 14 on the basis of information on the voltage being applied to the extraction electrode 12 as well as conditions for the voltage applied to the extraction electrode 12 and the voltage applied to the incident-side electrode 14 under which the electron beam EB is converged on the energy selection slit 44, and applies the determined voltage to the incident-side electrode 14.

The incident-side electrode controller 60 acquires the information on the voltage being applied to the extraction electrode 12 from the extraction electrode controller 50. For example, the incident-side electrode controller 60 acquires the information by receiving information on the voltage being applied to the extraction electrode 12 which is output from the extraction electrode controller 50 at predetermined time intervals.

Information on the conditions for the voltage applied to the extraction electrode 12 and the voltage applied to the incident-side electrode 14 under which the electron beam EB is converged on the energy selection slit 44 is stored in the storage device 62. The foregoing information can be obtained by, e.g., recording the voltage applied to the incident-side electrode 14 when the electron beam EB is converged on the energy selection slit 44 by changing the voltage applied to the extraction electrode 12. It may also be possible to perform interpolation, such as linear interpolation or interpolation using an n-th degree function, between individual points representing data showing the conditions for the voltage applied to the extraction electrode 12 and the voltage applied to the incident-side electrode 14 thus obtained and use the resulting data as the foregoing information.

1.3. Characteristic Features

The electron microscope 100 has, e.g., the following characteristic features.

The electron microscope 100 includes the electron source 10, the extraction electrode 12 that extracts the electron beam EB from the electron source 10, the monochromator 40 having the energy filter 42 that disperses the electron beam EB emitted from the electron source 10 based on the energy thereof and the energy selection slit 44 that selects the energy of the electron beam EB, the incident-side electrode 14 provided between the extraction electrode 12 and the monochromator 40, and the incident-side electrode controller 60 that controls the incident-side electrode 14 based on a change in the voltage applied to the extraction electrode 12.

Accordingly, in the electron microscope 100, the incident-side electrode 14 is controlled based on a change in the voltage applied to the extraction electrode 12. As a result, even when the voltage applied to the extraction electrode 12 is changed, it is possible to prevent the position of the convergence plane of the electron beam EB from being changed. This allows the state where the electron beam EB is converged on the energy selection slit 44 to be kept even when the voltage applied to the extraction electrode 12 is changed. Thus, in the electron microscope 100, it is possible to reduce the influence of a change in the voltage applied to the extraction electrode 12 which is exerted on the monochromator 40 and allow the monochromator 40 to have intended performance.

In the electron microscope 100, the incident-side electrode controller 60 controls the voltage applied to the incident-side electrode 14 to prevent the position of the convergence plane of the electron beam EB from being changed by a change in the voltage applied to the extraction electrode 12. Accordingly, in the electron microscope 100, even when the voltage applied to the extraction electrode 12 is changed, it is possible to keep the state where the electron beam EB is converged on the energy selection slit 44.

In the electron microscope 100, the incident-side electrode controller 60 controls the voltage applied to the incident-side electrode 14 such that the position where the electron beam EB is converged is located on the energy selection slit 44. Accordingly, in the electron microscope 100, even when the voltage applied to the extraction electrode 12 is changed, it is possible to keep the state where the electron beam EB is converged on the energy selection slit 44.

In the electron microscope 100, between the incident-side electrode 14 and the monochromator 40, the electrostatic lens 15 is formed. By controlling the voltage applied to the incident-side electrode 14, the effect of the electrostatic lens 15 with respect to the electron beam EB is changed. Accordingly, in the electron microscope 100, by controlling the voltage applied to the incident-side electrode 14, the position of the convergence plane of the electron beam EB can be controlled.

A method of controlling the electron microscope according to the first embodiment is a method of controlling the electron microscope including the electron source 10, the extraction electrode 12 that extracts the electron beam EB from the electron source 10, the monochromator 40 having the energy filter 42 that disperses the electron beam EB emitted from the electron source 10 based on the energy thereof and the energy selection slit 44 that selects the energy of the electron beam EB, and the incident-side electrode 14 provided between the extraction electrode 12 and the energy filter 42. The method according to the first embodiment controls the incident-side electrode 14 based on a change in the voltage applied to the extraction electrode 12.

As a result, in the first embodiment, even when the voltage applied to the extraction electrode 12 is changed, it is possible to keep the state where the electron beam EB is converged on the energy selection slit 44. Accordingly, it is possible to reduce the influence of a change in the voltage applied to the extraction electrode 12 which is exerted on the monochromator 40 and allow the monochromator 40 to have intended performance.

2. Second Embodiment

2.1. Electron Microscope

Figure 3:
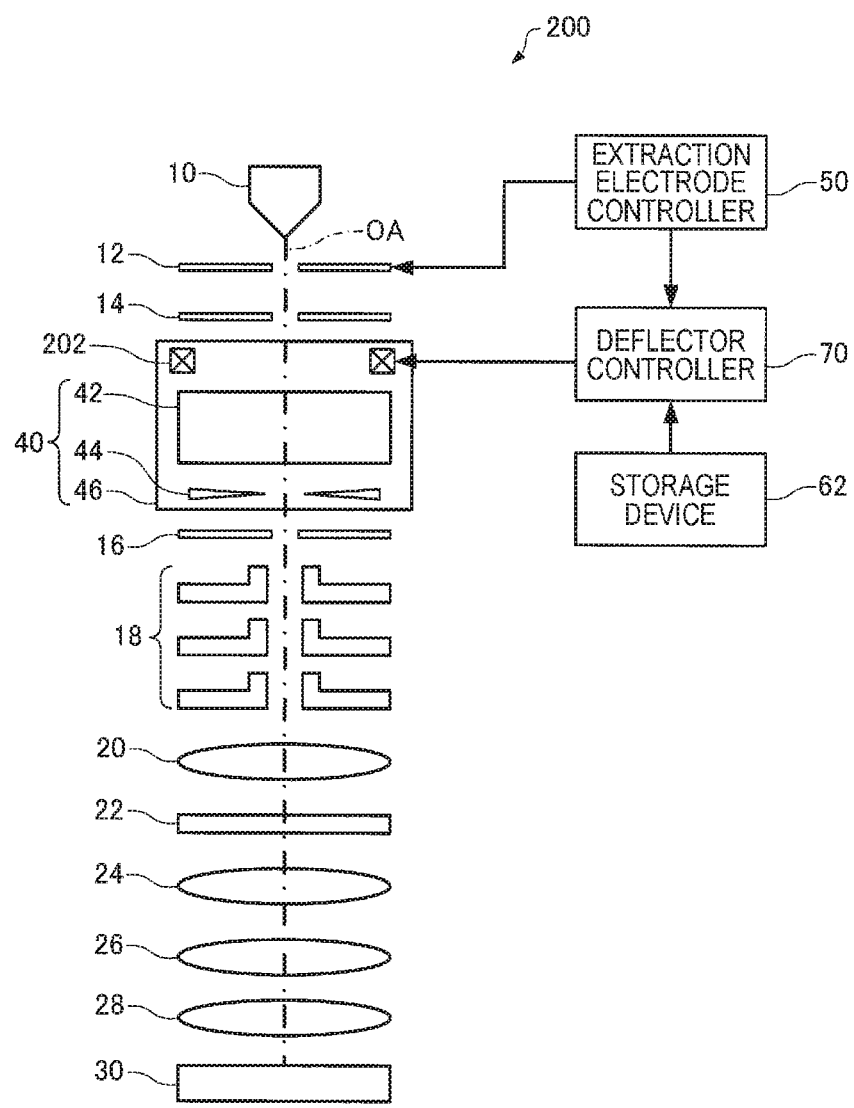
FIG. 3 is a diagram illustrating a configuration of an electron microscope according to a second embodiment.
Figure 4:
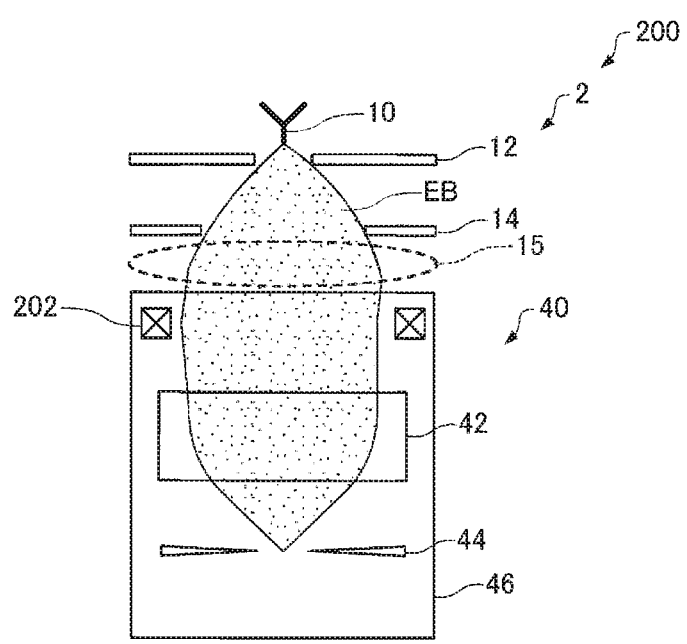
FIG. 4 is a diagram illustrating a configuration of an electron gun in the electron microscope according to the second embodiment.

Next, a description will be given of an electron microscope according to a second embodiment with reference to the drawings. FIG. 3 is a diagram illustrating a configuration of an electron microscope 200 according to the second embodiment. FIG. 4 is a diagram illustrating a configuration of the electron gun 2 in the electron microscope 200 according to the second embodiment. In the electron microscope 200 according to the second embodiment, members having the same functions as those of the constituent members of the electron microscope 100 according to the first embodiment are hereinafter given the same reference numerals, and a detailed description thereof is omitted.

As illustrated in FIGS. 3 and 4, the electron microscope 200 is different from the electron microscope 100 illustrated in FIGS. 1 and 2 described above in that the electron microscope 200 includes a deflector 202 provided between the extraction electrode 12 and the energy filter 42 and a deflector controller 70 that deflects the deflector 202.

The deflector 202 is provided in the casing 46 of the monochromator 40. The deflector 202 may be, e.g., an electromagnetic deflector (deflection coil) that forms a magnetic field for deflecting the electron beam EB or an electrostatic deflector that forms an electrostatic field for deflecting the electron beam EB. The deflector 202 deflects the electron beam EB emitted from the electron source 10 and causes the deflected electron beam EB to be incident on the energy filter 42.

The deflector controller 70 controls the deflector 202. The function of the deflector controller 70 can be implemented using, e.g., a dedicated circuit.

2.2. Operation of Electron Microscope

Next, a description will be given of the operation of the electron microscope 200. The description is given herein of the operations of the extraction electrode controller 50 and the deflector controller 70.

As describe above in "1.2. Operation of Electron Microscope 100", the extraction electrode controller 50 controls the voltage applied to the extraction electrode 12 such that a beam current emitted from the electron source 10 has an intended current value.

When the voltage applied to the extraction electrode 12 is changed, under the influence of axial misalignment resulting from an error in mechanically assembling the electron source 10, the extraction electrode 12, and the incident-side electrode 14, the angle of incidence of the electron beam EB with respect to the energy filter 42 is also changed. As a result, the position where the electron beam EB is converged on the energy selection slit 44, i.e., the position where the electron beam EB is converged in a direction orthogonal to the optical axis OA is displaced. Accordingly, the deflector controller 70 controls the deflector 202 based on a change in the voltage applied to the extraction electrode 12.

Specifically, the deflector controller 70 controls an amount of deflection of the electron beam EB in the deflector 202 to prevent the angle of incidence of the electron beam EB with respect to the energy filter 42 from being changed by a change in the voltage applied to the extraction electrode 12. The amount of deflection of the electron beam EB in the deflector 202 can be controlled using the current (or voltage) applied to the deflector 202.

Due to the control of the deflector 202 by the deflector controller 70, even when the voltage applied to the extraction electrode 12 is changed, the angle of incidence of the electron beam EB with respect to the energy filter 42 can be maintained at an intended angle of incidence.

The deflector controller 70 determines the current (or voltage) to be applied to the deflector 202 on the basis of information on the voltage being applied to the extraction electrode 12 and conditions for the voltage applied to the extraction electrode 12 and the current (or voltage) applied to the deflector 202 under which the electron beam EB has an intended angle of incidence with respect to the energy filter 42, and applies the determined current (or voltage) to the deflector 202.

The deflector controller 70 acquires the information on the voltage being applied to the extraction electrode 12 from the extraction electrode controller 50. For example, the deflector controller 70 acquires the information by receiving information on the voltage being applied to the extraction electrode 12 which is output from the extraction electrode controller 50 at predetermined time intervals.

Information on the conditions for the voltage applied to the extraction electrode 12 and the current (or voltage) applied to the deflector 202 under which the electron beam EB has an intended angle of incidence with respect to the energy filter 42 is stored in the storage device 62. The foregoing information can be obtained by, e.g., recording the current (or voltage) applied to the deflector 202 when the electron beam EB has the intended angle of incidence by changing the voltage applied to the extraction electrode 12. It may also be possible to perform interpolation, such as linear interpolation or interpolation using an n-th degree function, between individual points representing data showing the conditions for the voltage applied to the extraction electrode 12 and the voltage applied to the deflector 202 thus obtained and use the resulting data as the foregoing information.

2.3. Characteristic Features

The electron microscope 200 has, e.g., the following characteristic features.

The electron microscope 200 includes the electron source 10, the extraction electrode 12 that extracts the electron beam EB from the electron source 10, the monochromator 40 having the energy filter 42 that disperses the electron beam EB emitted from the electron source 10 based on the energy thereof and the energy selection slit 44 that selects the energy of the electron beam EB, the deflector 202 provided between the extraction electrode 12 and the energy filter 42, and the deflector controller 70 that controls the deflector 202 based on a change in the voltage applied to the extraction electrode 12.

Accordingly, in the electron microscope 200, the deflector 202 is controlled based on a change in the voltage applied to the extraction electrode 12. As a result, even when the voltage applied to the extraction electrode 12 is changed, it is possible to prevent the angle of incidence of the electron beam EB with respect to the energy filter 42 from being changed. This allows the state where the electron beam EB is incident on the energy filter 42 at the intended angle of incidence to be kept even when the voltage applied to the extraction electrode 12 is changed. Thus, in the electron microscope 200, it is possible to reduce the influence of a change in the voltage applied to the extraction electrode 12 which is exerted on the monochromator 40 and allow the monochromator 40 to have intended performance.

In the electron microscope 200, the deflector controller 70 controls the amount of deflection of the electron beam EB in the deflector 202 to prevent the angle of incidence of the electron beam EB with respect to the energy filter 42 from being changed by a change in the voltage applied to the extraction electrode 12. Accordingly, in the electron microscope 200, even when the voltage applied to the extraction electrode 12 is changed, it is possible to keep the state where the electron beam EB is incident on the energy filter 42 at the intended angle of incidence.

A method of controlling the electron microscope according to the second embodiment is a method of controlling the electron microscope including the electron source 10, the extraction electrode 12 that extracts the electron beam EB from the electron source 10, the monochromator 40 having the energy filter 42 that disperses the electron beam EB emitted from the electron source 10 based on the energy thereof and the energy selection slit 44 that selecting the energy of the electron beam EB, and the deflector 202 that is provided between the extraction electrode 12 and the energy filter 42 and deflects the electron beam EB. The method according to the second embodiment controls the deflector 202 based on a change in the voltage applied to the extraction electrode 12.

As a result, in the second embodiment, even when the voltage applied to the extraction electrode 12 is changed, it is possible to keep the state where the electron beam EB is incident on the energy filter 42 at the intended angle of incidence. Accordingly, it is possible to reduce the influence of a change in the voltage applied to the extraction electrode 12 which is exerted on the monochromator 40 and allow the monochromator 40 to have intended performance.

3. Third Embodiment 3.1. Electron Microscope

Figure 5:
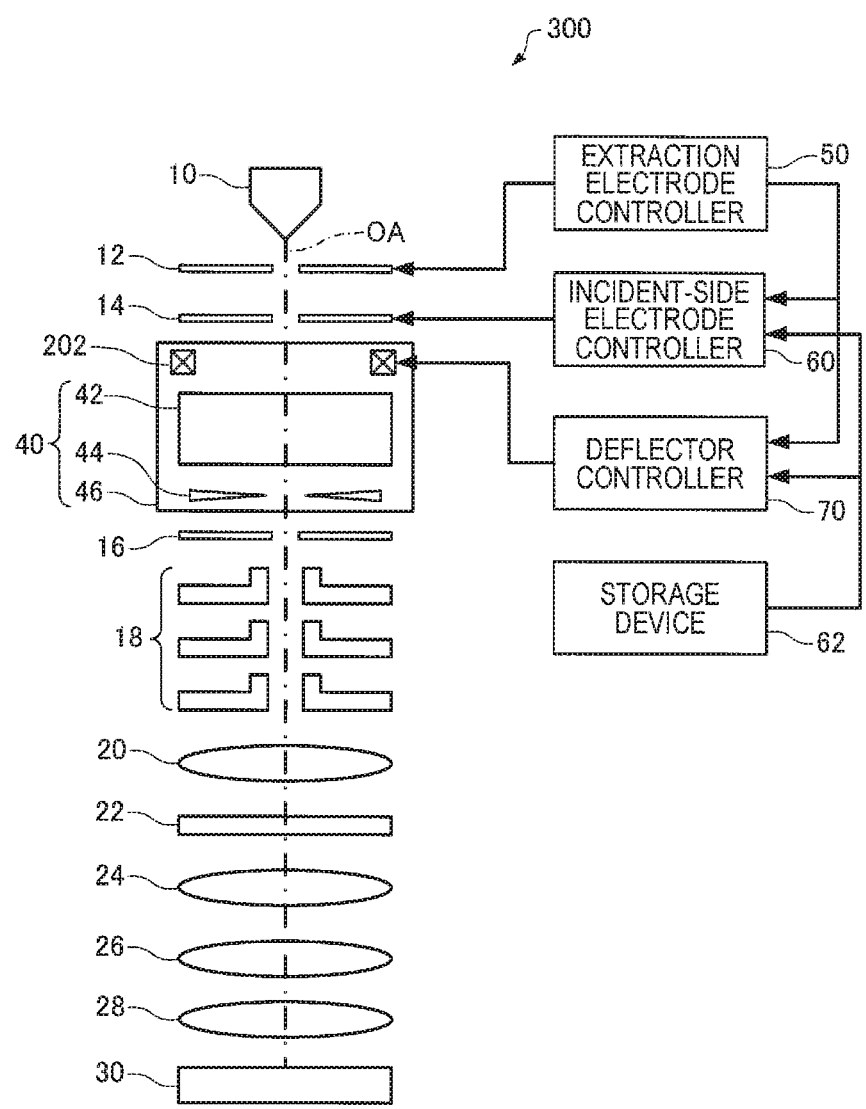
FIG. 5 is a diagram illustrating a configuration of an electron microscope according to a third embodiment.
Figure 6:
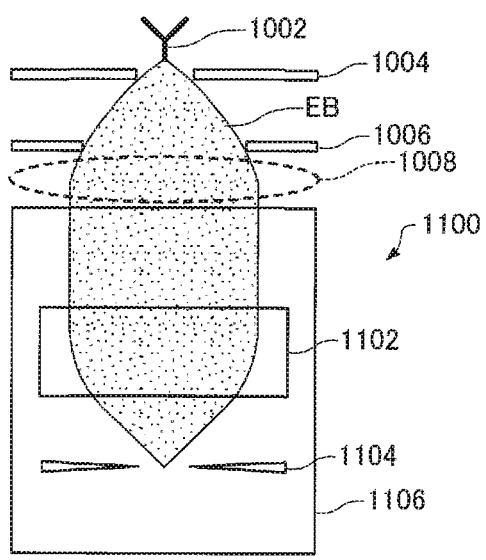
FIG. 6 is a diagram schematically illustrating an example of a configuration of a conventional monochromator with an internal electron gun.
Figure 7:
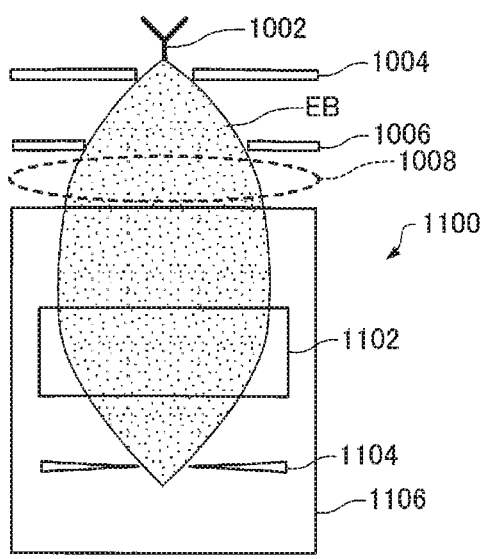
FIG. 7 is a diagram for illustrating the displacement of the convergence plane of an electron beam in the monochromator.
Figure 8:
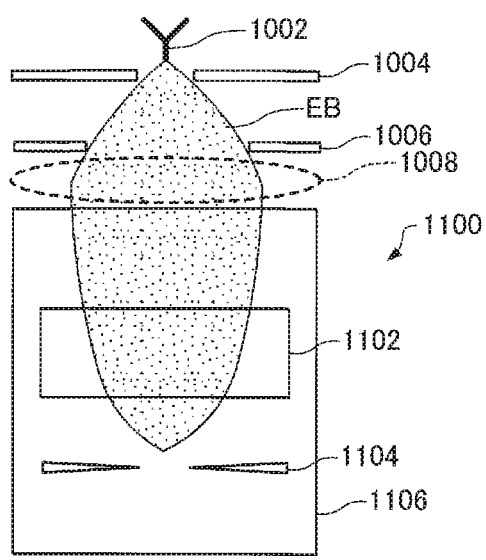
FIG. 8 is a diagram for illustrating the displacement of the convergence plane of the electron beam in the monochromator.
Figure 9:
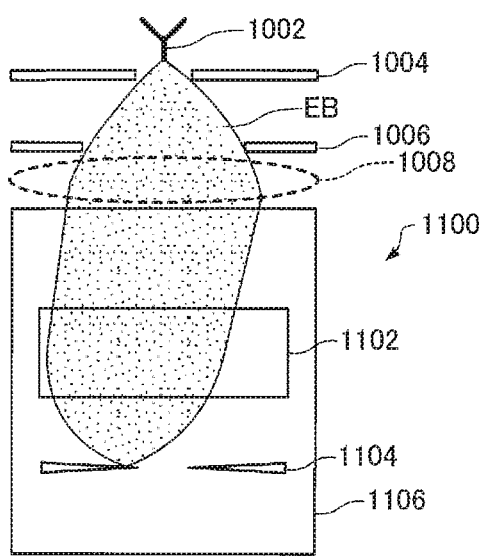
FIG. 9 is a diagram illustrating a state in the monochromator where the angle of incidence of the electron beam is changed by axial misalignment.

Next, a description will be given of an electron microscope according to a third embodiment with reference to the drawings. FIG. 5 is a diagram illustrating a configuration of an electron microscope 300 according to the third embodiment. In the electron microscope 300 according to the third embodiment, members having the same functions as those of the respective constituent members of the electron microscope 100 according to the first embodiment and the electron microscope 200 according to the second embodiment are hereinafter given the same reference numerals, and a detailed description thereof is omitted.

As illustrated in FIG. 5, the electron microscope 300 includes the incident-side electrode 14, the deflector 202, the incident-side electrode controller 60 for controlling the incident-side electrode 14, and the deflector controller 70 for controlling the deflector 202.

3.2. Operation of Electron Microscope

The control of the incident-side electrode 14 by the incident-side electrode controller 60 is as described above in "1.2. Operation of Electron Microscope". The control of the deflector 202 by the deflector controller 70 is as described above in "2.2. Operation of Electron Microscope".

3.3. Characteristic Features

The electron microscope 300 includes the incident-side electrode 14 provided between the extraction electrode 12 and the monochromator 40, the incident-side electrode controller 60 that controls the incident-side electrode 14 based on a change in the voltage applied to the extraction electrode 12, the deflector 202 provided between the extraction electrode 12 and the energy filter 42, and the deflector controller 70 that controls the deflector 202 based on a change in the voltage applied to the extraction electrode 12.

Accordingly, in the electron microscope 300, even when the voltage applied to the extraction electrode 12 is changed, it is possible to prevent the position of the convergence plane of the electron beam EB and the angle of incidence of the electron beam EB with respect to the energy filter 42 from being changed. As a result, even when the voltage applied to the extraction electrode 12 is changed, it is possible to keep the state where the electron beam EB is converged on the energy selection slit 44 and the state where the electron beam EB is incident on the energy filter 42 at an intended angle of incidence. Thus, in the electron microscope 300, it is possible to reduce the influence of a change in the voltage applied to the extraction electrode 12 which is exerted on the monochromator 40 and allow the monochromator 40 to have intended performance.

Note that the invention is not limited to the embodiments described above and can variously be modified to be practiced within the scope of the gist of the invention.

For example, the transmission electron microscope (TEM) has been described as an electron microscope according to one embodiment of the invention. However, an electron microscope according to one embodiment of the invention is not limited to the transmission electron microscope, and may also be a scanning transmission electron microscope (STEM) or a scanning electron microscope (SEM).

Note that the embodiments and the modifications which are described above are only exemplary, and the invention is not limited thereto. For example, the embodiments and the modifications can appropriately be combined.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

The invention claimed is:

1. An electron microscope comprising:
an electron source;
an extraction electrode that extracts an electron beam from the electron source;
a monochromator having an energy filter that disperses the electron beam emitted from the electron source based on an energy of the electron beam, and an energy selection slit that selects the energy of the electron beam;
an incident-side electrode provided between the extraction electrode and the monochromator; and
an incident-side electrode controller that controls the incident-side electrode based on a change in a voltage applied to the extraction electrode by an extraction electrode controller,
wherein the incident-side electrode controller controls the incident-side electrode to cause the electron beam to converge on the energy selection slit.

2. The electron microscope according to claim 1,
wherein the incident-side electrode controller controls a voltage applied to the incident-side electrode to prevent a position of a convergence plane of the electron beam from being changed by the change in the voltage applied to the extraction electrode.

3. The electron microscope according to claim 1,
wherein an electrostatic lens is formed between the incident-side electrode and the monochromator, and wherein a voltage applied to the incident-side electrode is controlled by the incident-side electrode controller to change an effect of the electrostatic lens with respect to the electron beam.

4. The electron microscope according to claim 1, further comprising:
a deflector that is provided between the extraction electrode and the energy filter and deflects the electron beam, and
a deflector controller, wherein the deflector controller controls the deflector based on the change in the voltage applied to the extraction electrode.

5. The electron microscope according to claim 4,
wherein the deflector controller controls an amount of deflection of the electron beam in the deflector to prevent an angle of incidence of the electron beam with respect to the energy filter from being changed by the change in the voltage applied to the extraction electrode.

6. The electron microscope according to claim 1, wherein the incident-side electrode controller determines a voltage to be applied to the incident-side electrode based on information about the change in the voltage applied to the extraction electrode, and wherein the incident-side electrode controller applies the determined voltage to the incident-side electrode.

7. The electron microscope according to claim 6, wherein the incident-side electrode controller acquires the information about the change in the voltage applied to the extraction electrode from the extraction electrode controller.

8. An electron microscope comprising:
an electron source;
an extraction electrode that extracts an electron beam from the electron source;
a monochromator having an energy filter that disperses the electron beam emitted from the electron source based on an energy of the electron beam, and an energy selection slit that selects the energy of the electron beam;
a deflector that is provided between the extraction electrode and the energy filter and deflects the electron beam; and
a controller that controls the deflector based on a change in a voltage applied to the extraction electrode,
wherein the controller controls the deflector to cause the electron beam to converge on the energy selection slit.

9. The electron microscope according to claim 8, wherein the controller determines a voltage to be applied to the deflector based on information about the change in the voltage applied to the extraction electrode, and wherein the controller applies the determined voltage to the deflector.

10. The electron microscope according to claim 9, wherein the controller acquires the information about the change in the voltage applied to the extraction electrode from an extraction electrode controller.

11. A method of controlling an electron microscope comprising:
an electron source; an extraction electrode that extracts an electron beam from the electron source;
a monochromator having an energy filter that disperses the electron beam emitted from the electron source based on an energy of the electron beam, and an energy selection slit that selects the energy of the electron beam; and an incident-side electrode provided between the extraction electrode and the monochromator, the method comprising:

controlling the incident-side electrode based on a change in a voltage applied to the extraction electrode,
wherein the incident-side electrode is controlled to cause the electron beam to converge on the energy selection slit.

12. A method of controlling an electron microscope comprising:
an electron source; an extraction electrode that extracts an electron beam from the electron source;
a monochromator having an energy filter that disperses the electron beam emitted from the electron source based on an energy of the electron beam, and an energy selection slit that selects the energy of the electron beam; and a deflector that is provided between the extraction electrode and the energy filter and deflects the electron beam, the method comprising:
controlling the deflector based on a change in a voltage applied to the extraction electrode,
wherein the deflector is controlled to cause the electron beam to converge on the energy selection slit.

* * * * *